(12) United States Patent
Tisserand et al.

(10) Patent No.: US 10,263,551 B2
(45) Date of Patent: Apr. 16, 2019

(54) METHOD FOR CONTROLLING REGULATING DEVICE FOR REGULATING AUTOMOTIVE VEHICLE ALTERNATOR, CORRESPONDING REGULATING DEVICE AND ALTERNATOR

(71) Applicant: VALEO EQUIPEMENTS ELECTRIQUES MOTEUR, Creteil Cedex (FR)

(72) Inventors: Pierre Tisserand, Limeil Brevannes (FR); Pierre Chassard, Creteil (FR); Thibault Arrou, Suresnes (FR); Giuseppe Pasetti, Pisa (IT); Francesco Tinfena, La Spezia (IT); Alexandre Schmitt, Creteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 15/535,637

(22) PCT Filed: Dec. 8, 2015

(86) PCT No.: PCT/FR2015/053370
§ 371 (c)(1),
(2) Date: Jun. 13, 2017

(87) PCT Pub. No.: WO2016/097531
PCT Pub. Date: Jun. 23, 2016

(65) Prior Publication Data
US 2017/0346428 A1   Nov. 30, 2017

(30) Foreign Application Priority Data

Dec. 15, 2014 (FR) .................................. 14 62404

(51) Int. Cl.
*H02P 9/00* (2006.01)
*H02H 7/06* (2006.01)
(Continued)

(52) U.S. Cl.
CPC ............... *H02P 9/006* (2013.01); *F02D 29/02* (2013.01); *H02H 7/06* (2013.01); *H02J 7/242* (2013.01);
(Continued)

(58) Field of Classification Search
CPC .................................. H02P 9/305; H02P 9/006
(Continued)

(56) References Cited

U.S. PATENT DOCUMENTS

| 4,658,200 A | 4/1987 | Kouge | |
| 5,521,486 A * | 5/1996 | Takamoto | H02J 7/1461 322/28 |
| 6,040,676 A | 3/2000 | Nordquist et al. | |
| 6,163,138 A * | 12/2000 | Kohl | H02J 7/245 322/25 |
| 6,555,993 B2 * | 4/2003 | Taniguchi | H02J 7/1461 322/17 |

(Continued)

FOREIGN PATENT DOCUMENTS

FR   2642580 A1   8/1990
FR   2910639 A1   6/2008

*Primary Examiner* — Julio C. Gonzalez
(74) *Attorney, Agent, or Firm* — Berenato & White, LLC (57) ABSTRACT

The method of control according to the invention slaves a DC voltage generated by the alternator to a predetermined setpoint value by controlling an excitation current flowing in an excitation circuit comprising an excitation winding of a rotor of the alternator. The excitation current is controlled by means of a semiconductor switch, in turn controlled by a control signal having a predetermined period. The method comprises a detection of a failure of the excitation circuit. At least one short-circuit of the excitation winding is detected.

(Continued)

According to another characteristic of the method, the control signal is generated on the basis of a combination of a setpoint signal formed by pulses of the predetermined period exhibiting a duty ratio representative of the setpoint value and of a detection signal indicative of the short-circuit.

17 Claims, 6 Drawing Sheets

(51) Int. Cl.
| | |
|---|---|
| *H02J 7/24* | (2006.01) |
| *H02P 9/30* | (2006.01) |
| *H03K 17/082* | (2006.01) |
| *F02D 29/02* | (2006.01) |
| *G01R 31/34* | (2006.01) |
| *H02P 101/45* | (2016.01) |

(52) U.S. Cl.
CPC ......... *H02P 9/305* (2013.01); *H03K 17/0822* (2013.01); *G01R 31/343* (2013.01); *H02P 2101/45* (2015.01)

(58) Field of Classification Search
USPC .................................... 322/44, 59, 24, 28
See application file for complete search history.

(56) References Cited

U.S. PATENT DOCUMENTS

| | | | |
|---|---|---|---|
| 6,670,792 B1* | 12/2003 | Renehan | H02J 7/245 322/17 |
| 7,521,903 B2* | 4/2009 | Renehan | H02J 7/242 322/17 |
| 8,618,829 B2 | 12/2013 | Pierret et al. | |
| 2004/0008008 A1* | 1/2004 | Uematsu | H02H 7/06 322/28 |
| 2004/0113593 A1* | 6/2004 | Aoyama | H02J 7/242 322/28 |

* cited by examiner

METHOD FOR CONTROLLING REGULATING DEVICE FOR REGULATING AUTOMOTIVE VEHICLE ALTERNATOR, CORRESPONDING REGULATING DEVICE AND ALTERNATOR

CROSS-REFERENCE TO RELATED APPLICATIONS AND CLAIM TO PRIORITY

This application is a national stage application of International Application No. PCT/FR2015/053370 filed Dec. 8, 2015, which claims priority to French Patent Application No. 1462404 filed Dec. 15, 2014, the disclosures of which are incorporated herein by reference and to which priority is claimed.

FIELD OF THE INVENTION

The present invention relates to a method of controlling a device for regulating an automotive vehicle alternator. The invention also relates to this regulating device as well as the alternator containing this regulating device.

BACKGROUND OF THE INVENTION

For obvious safety reasons, important items of equipment in an automotive vehicle are fitted with devices for detecting and indicating any operational anomaly.

The on-board generator, usually consisting of an alternator with rectified phase voltages, is one of these important items of equipment and every driver is familiar with the position of the red light marked "charge" on the dashboard of his car.

The widespread use of electronics on board vehicles, often as a replacement for electromechanical components, enables even finer detection of operating faults and of the circumstances of breakdowns, for purposes of either diagnostics, communication or protection of the equipment.

For example, the electronic voltage regulator described in patent application FR2642580 of the VALEO EQUIPEMENTS ELECTRIQUES MOTEUR company contains fault-detecting means which analyse the correspondence between various accessible parameters, in particular the correspondence between:
  the voltage at the output of the alternator and the voltage at the terminals of the field winding;
  the voltage at the output of the alternator and the voltage at the terminals of the phase inputs.

The second case allows the following faults to be detected indirectly:
  no rotation of the alternator (broken fan belt);
  an open excitation circuit (open field winding, brush jammed in its housing, etc. . . . ).

The VALEO EQUIPEMENTS ELECTRIQUES MOTEUR company in patent application FR2910639 described a similar method for finding a solution for continuing the excitation circuit applying if the magnetic circuit of the alternator comprises permanent magnets or exhibits strong residual magnetism.

Modern alternator regulators integrate a power switch, generally a transistor known as "high side", which controls an excitation current flowing in an excitation winding of a rotor of the alternator.

The rotor creates a magnetic field, the value of which is adjusted by the excitation current, in order to maintain the DC voltage generated by the alternator at the desired value, after rectifying the phase voltages.

However the output of this power switch can be short-circuited, a type of failure of the excitation circuit which is not detected in the known methods pointed out above and which thus requires to be improved.

SUMMARY OF THE INVENTION

The present invention is thus aimed at alleviating the disadvantages of the lack of detecting this type of failure in order to deal with a short-circuit current and to guarantee the integrity of the components of the regulator.

According to a first aspect, the invention relates to a method of controlling a device for regulating an automotive vehicle alternator slaving a DC voltage generated by this alternator to a predetermined setpoint value.

This DC voltage is slaved by controlling a current flowing in an excitation circuit comprising an excitation winding of a rotor of the alternator by means of a semiconductor switch controlled by a control signal having a predetermined period.

The method of controlling a device for regulating an automotive vehicle alternator, aim of this invention, is of the type of those commonly known comprising detection of a failure of the excitation circuit.

In the inventive method at least one short-circuit of the excitation winding is detected.

According to the invention, the control signal is generated on the basis of a combination of a setpoint signal formed by pulses of the predetermined period exhibiting a duty ratio representative of the setpoint value and of a detection signal indicative of the short-circuit.

According to the invention again, the semiconductor switch as transconductor is controlled by the control signal during at least a first part of this predetermined period with at least one predetermined current slope by limiting an intensity of the excitation current to a predetermined limit value.

At the same time or otherwise, according to the invention, the semiconductor switch is changed to a conductive state by the control signal during at least a second part of the predetermined period by limiting this intensity of the excitation current to this predetermined limit value.

In the inventive method,
  as soon as the intensity of the excitation current reaches a predetermined high threshold, a first counter is started during a first predetermined time delay;
  during this first time delay, an estimated value of a short-circuit state is calculated on the basis of the intensity of the excitation current;
  after the first time delay, if the estimated value of the short-circuit state is above a predetermined low threshold, the detection signal is activated;
  if the estimated value of the short-circuit state is below the low threshold, the first counter is re-initialised;
  after activation of the detection signal, the semiconductor switch is controlled by the control signal with the predetermined current slope to make a transition to an open state;
  a second predetermined time delay is generated by means of a second counter and the semiconductor switch is maintained in the open state during the second time delay.

According to a particular embodiment of the method of the invention, the estimated value of the short-circuit state is the median value of the intensity of the excitation current.

According to another characteristic of the invention, the limit value and the first time delay are defined so that a power to be dissipated is less than a maximum power permissible by a heat sink of the semiconductor switch.

The invention also relates to a device for regulating an automotive vehicle alternator designed to implement the method described above.

This device comprises means of slaving a DC voltage generated by the alternator to a predetermined setpoint value by controlling a current flowing in an excitation circuit comprising an excitation winding of a rotor of the alternator by means of a semiconductor switch controlled by a control signal of a predetermined period.

The regulating device in question is of the type of those moreover comprising means of detection of a failure of the excitation circuit.

In the regulating device according to the invention, these means of detection detect at least one short-circuit of the excitation winding.

According to the invention, the slaving means comprise a regulation loop generating a setpoint signal formed by pulses of the predetermined period exhibiting a duty ratio representative of the setpoint value and the means of detection comprise a detection module generating a detection signal indicative of the short-circuit.

The regulating device according to the invention moreover comprises means to combine the setpoint signal and the detection signal producing an input signal of a control circuit generating the control signal.

In the regulating device according to the invention, the detection module comprises:
  means to memorise a predetermined high threshold and a predetermined low threshold;
  means to acquire an intensity of the excitation current;
  first means to compare this intensity with the predetermined high threshold and the predetermined low threshold;
  a first counter triggered by the means of comparison defining a first predetermined time delay;
  means to calculate an estimated value of the short-circuit on the basis of the excitation current during the first time delay;
  second means to compare this estimated value of the short-circuit with the predetermined low threshold;
  a second counter triggered by the second means of comparison defining a second predetermined time delay.

The invention is also aimed at an automotive vehicle alternator comprising a regulating device as previously described.

These few essential specifications will have made the advantages provided by the invention obvious to the person skilled in the art compared with the background art.

The detailed specifications of the invention are given in the following description in conjunction with the appended drawings. It should be noted that these drawings do not have an aim other than to illustrate the text of the description and do not in any way constitute a limitation in the scope of the invention.

DETAILED DESCRIPTION OF THE PREFERRED EMBODIMENT(S)

Alternator regulators often integrate a function to protect against short-circuit currents. These functions are elementary designs with a cut-off by the power switch whenever the current is exceeded relative to a preset value Icc_Th, as shown on FIG. 1.

Figure 1:
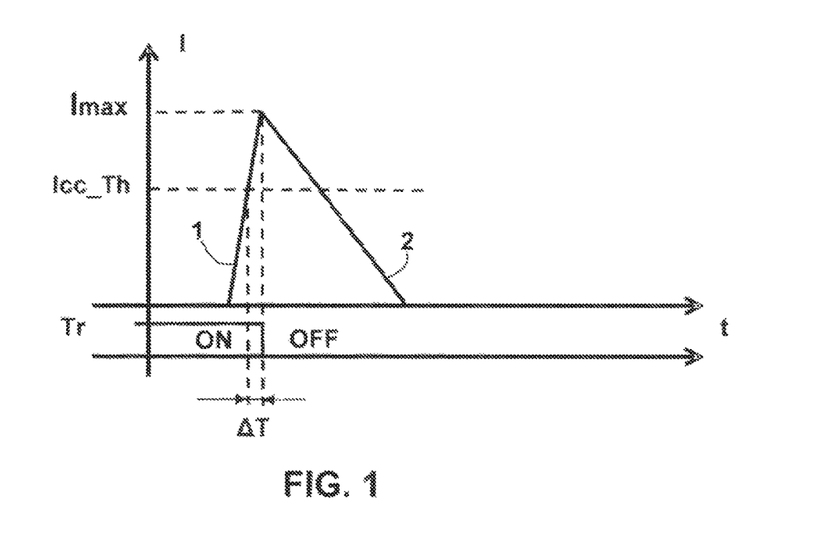
FIG. 1 illustrates an overload of the excitation current in the event of short-circuit of the excitation winding of the rotor of an alternator without the regulating device according to the invention.

If a short-circuit occurs in the power switch when the Tr transistor is in the conductive state ON, intensity I of the current in the excitation winding increases very rapidly with an ascending slope 1 only depending on the impedances present in the excitation circuit.

The short-circuit period $\Delta T$, i.e. the time during which the Tr transistor remains in the conductive state ON before the protection function commands it to switch to the open state OFF, depends on the reaction time of the electronics and is controlled to a minimum.

Therefore intensity I flowing in the excitation circuit can reach a very high Imax value whenever resistance $R_{DS}$ (ON) of a power transistor Tr of the MOSFET type remains very low, before intensity I decreases along a descending slope 2 when transistor Tr switches to an open state OFF.

Figure 2:
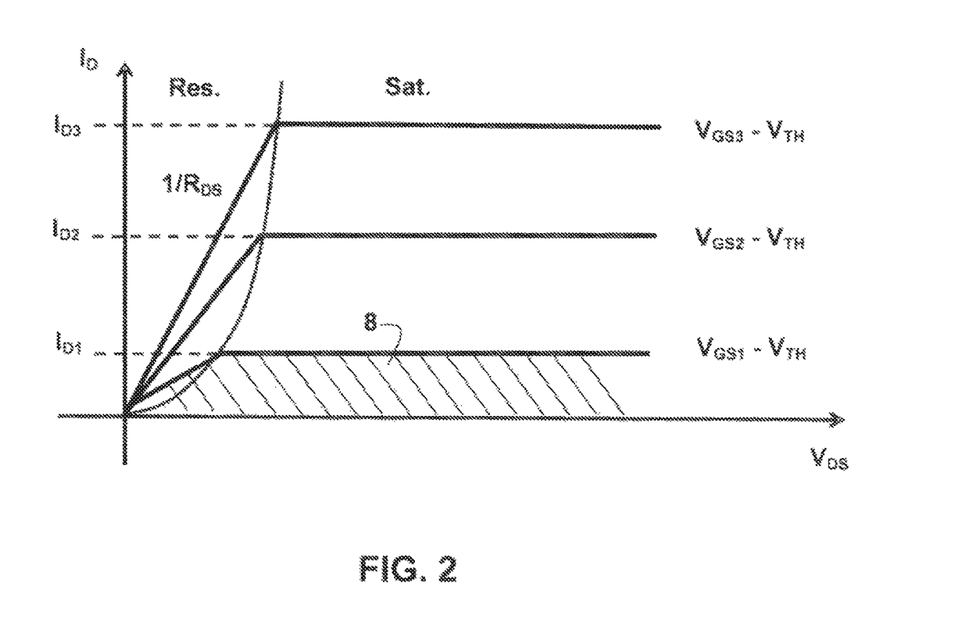
FIG. 2 shows a feature of a power transistor of the MOSFET type used in the regulating device according to the invention.
Figure 3:
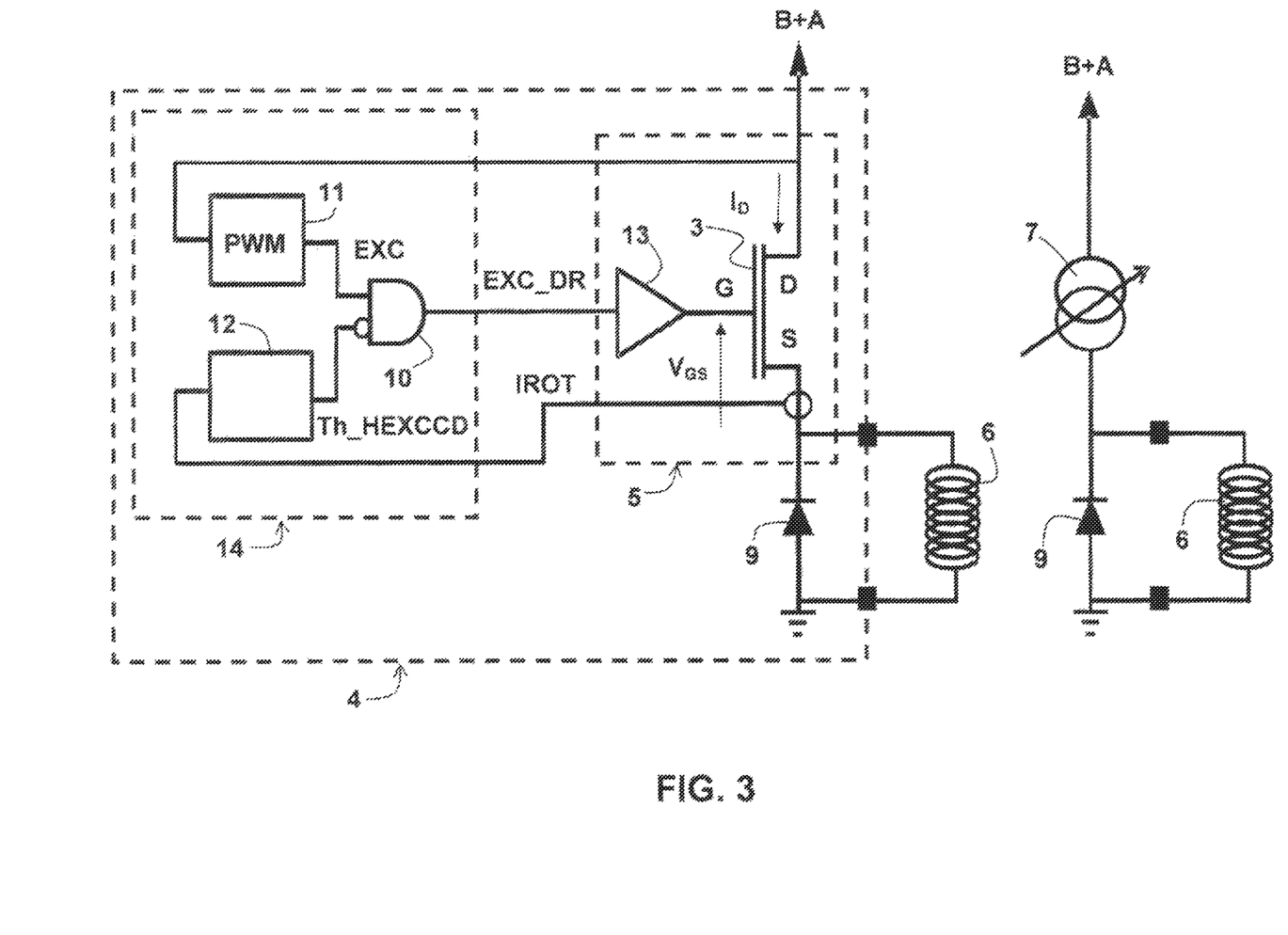
FIG. 3 illustrates a regulating device according to the invention and a model in transconductance mode of the power transistor, the feature of which is shown on FIG. 2.

The principle of the method for controlling a regulating device of an automotive vehicle alternator according to the invention is to use the dependence of a drain current $I_D$ of a MOSFET power transistor on a gate-source voltage $V_{GS}$ shown on FIG. 2 to control the "high side" switch 3 of the regulating device 4 shown on FIG. 3 in order to limit current $I_D$ in the power switch 5 when the excitation winding 6 is short-circuited.

In "common source" topology, outside the open mode OFF/conductive mode ON, a MOSFET transistor 3 can temporarily function in transconductance mode (in a saturation region "Sat." outside an ohmic region "Res." for a sufficiently high drain-source voltage $V_{DS}$), i.e. as a voltage-controlled generator 7 of current with infinite impedance, as the equivalent model of FIG. 3 shows.

For a low gate-source voltage $V_{GS1}$ (but above a threshold voltage $V_{TH}$), the intensity of drain $I_{D1}$ is low, for an average gate-source voltage $V_{GS2}$, the corresponding intensity of drain $I_{D2}$ is median and for a high gate-source voltage $V_{GS3}$, the intensity of drain $I_{D3}$ is strong, as FIG. 2 clearly shows.

In the inventive method, switch 3 is thus polarised with a gate-source voltage $V_{GS}$ such that the current flowing in switch 3 cannot exceed a predetermined value ILIM, as will be explained in connection with FIGS. 4a, 4b and 5.

For example, for the low gate-source voltage $V_{GS1}$, the intensity of the excitation current $I_D$ will be limited to the shaded zone 8 of FIG. 2.

It will be noted that switch 3 as current generator 7 too will be advantageously used to control the current commutated between this switch 3 and a free wheel diode 9.

The operation of the power switch 5 lasts for a fixed period T or more rarely has a variable frequency; in both cases the duty ratio r is variable in order to slave the output voltage B+A of the alternator to a setpoint value.

On FIG. 3, it will be noted that the power switch 5 is controlled by a combination 10 EXC_DR of a setpoint signal EXC (pulse width modulation of a duty ratio r calculated by the regulation algorithm 11) and a short-circuit detection signal Th_HEXCCD formed in a detection module 12.

Combination EXC_DR is applied to an input of a control circuit 13 which controls the gate G of power switch 3 with voltage $V_{GS}$.

When short-circuit SC occurs, two typical cases happen:
  short-circuit SC appears when switch 3 is in the open state OFF or during the transition of current conductance;
  short-circuit SC appears when switch 3 is in the conductive state ON.

Figure 4A:
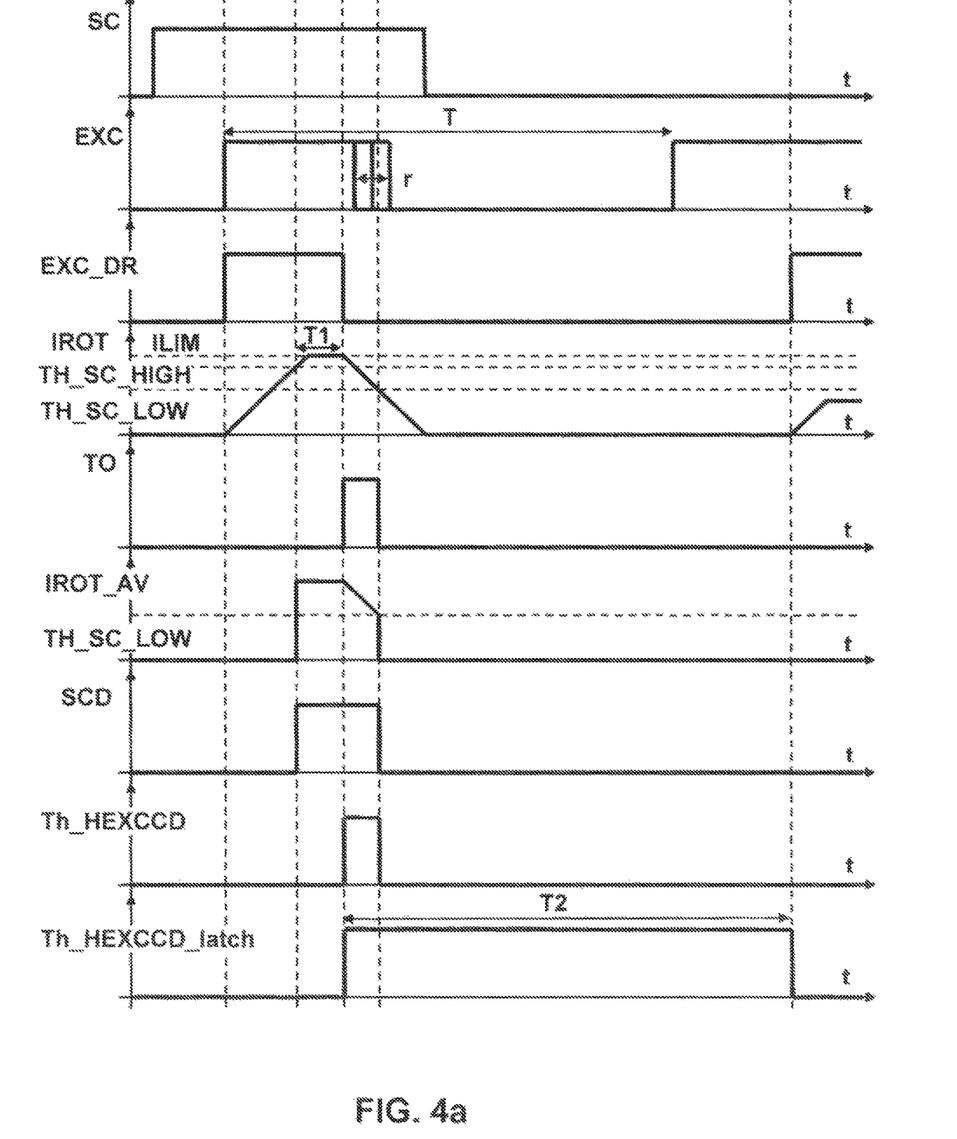
FIG. 4a illustrates time diagrams illustrating the method for controlling the regulating device according to the invention if the short-circuit occurs when the power transistor is in an open state.
Figure 5:
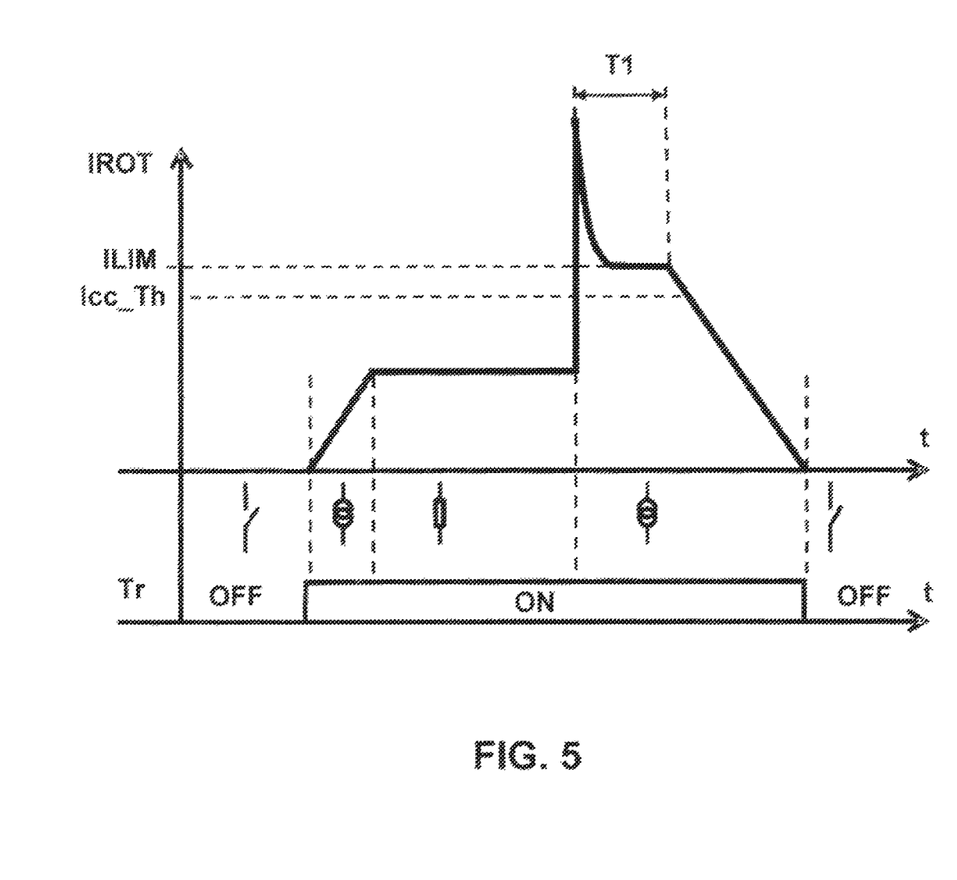
FIG. 5 illustrates time diagrams illustrating an alternative method for controlling the regulating device according to the invention if the short-circuit occurs when the power transistor is in a conductive state.

In the first case illustrated on FIG. 4a, intensity IROT of the excitation current increases along a predetermined current slope, when switch 3 is operated in transconductance mode.

When intensity IROT reaches a predetermined high threshold TH_SC_HIGH, it is considered that excitation winding 6 has short-circuited.

Intensity IROT of the current is then limited to a predetermined limit value ILIM during a first predetermined time delay T1, then decreases again along the predetermined current slope.

The first time delay T1 and limit value ILIM are defined so that the dissipation capacity is less than the maximum power which a heat sink of switch 3 can evacuate.

Figure 4B:
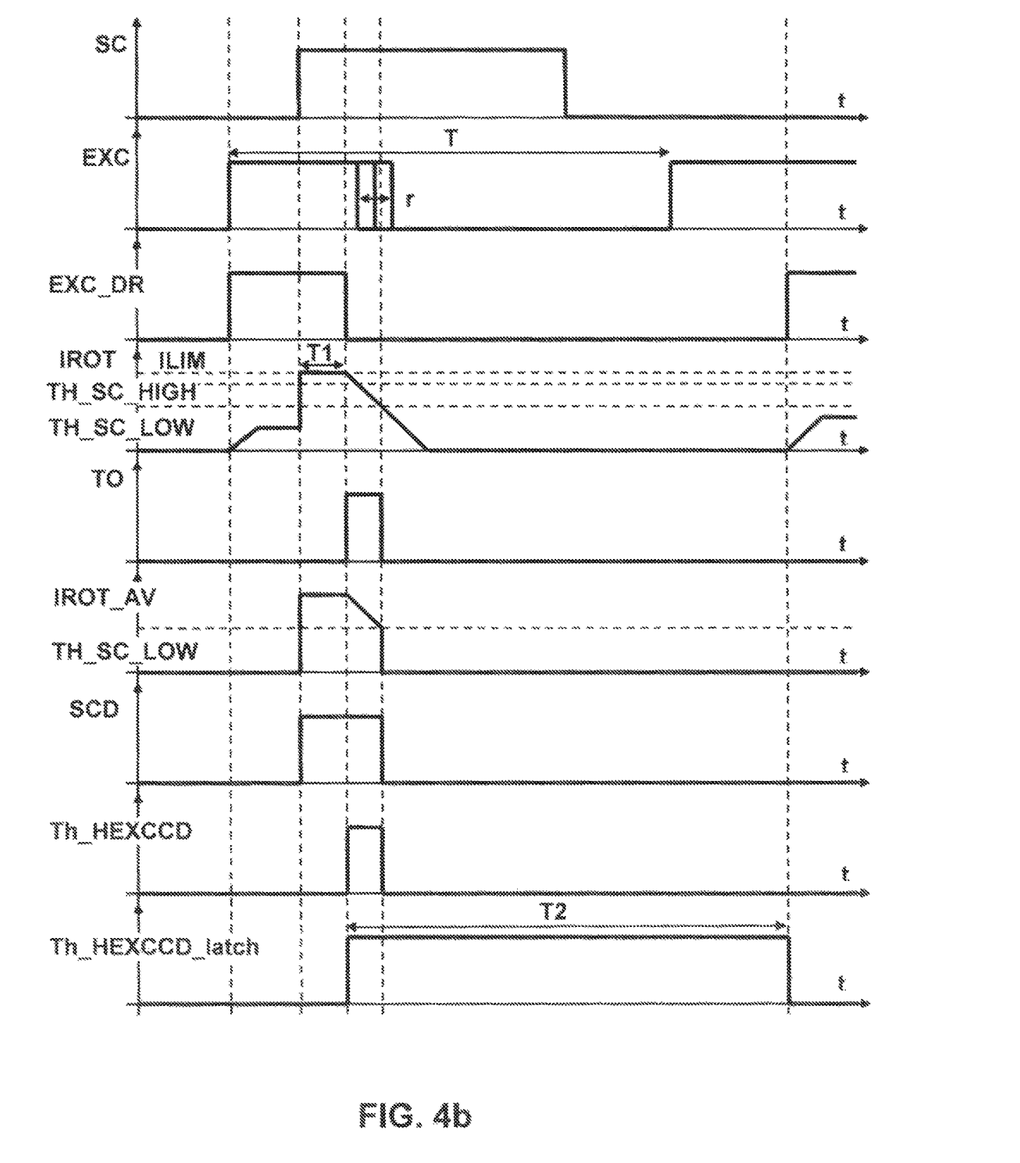
FIG. 4b illustrates time diagrams illustrating the method for controlling the regulating device according to the invention if the short-circuit occurs when the power transistor is in a conductive state.

In the second case illustrated on FIG. 4b, intensity IROT of the short-circuit current is limited to limit value ILIM during the first predetermined time delay T1, then decreases again along the predetermined current slope. A first solution is to use switch 3 to limit the current. This leads to the application of a gate-source voltage $V_{GS}$ less than a maximum value; the $R_{DS}$ (ON) is thus not minimum, which contributes to additional heating.

An alternative to this solution, when switch 3 is in the conductive state ON in the event of a short-circuit SC, is to change switch 3 to the conductive state, i.e. with a minimal drain-source resistance $R_{DS}$ (ON).

Whenever short-circuit SC is detected by the crossing of a threshold Icc_Th (FIG. 5), switch 3 immediately changes from the conductive/open mode to the transconductance mode and intensity IROT of the excitation current is limited to limit value ILIM during the first predetermined time delay T1.

It is noted that during the transition from the conductive state ON to the transconductance mode, the time for establishing the $V_{GS}$ voltage is not immediate. Intensity IROT of the short-circuit current in the worst case is B+A/$R_{DS}$ (ON), if an excitation circuit with no parasitic components is considered. Then it decreases to reach value ILIM, as FIG. 5 clearly shows. The current could have oscillations due to the capacitors and residual chokes present in the circuit.

A time of confirmation is determined by calculation so that an amount of heat generated by short-circuit SC can be dissipated by the heat sink of power switch 3. For this purpose, a second time delay T2 greater than a minimum time T retry min is fixed, before switch 3 changes to the conductive state because the short-circuit may occur at any time in comparison to the pulses of the setpoint signal EXC.

Figure 6:
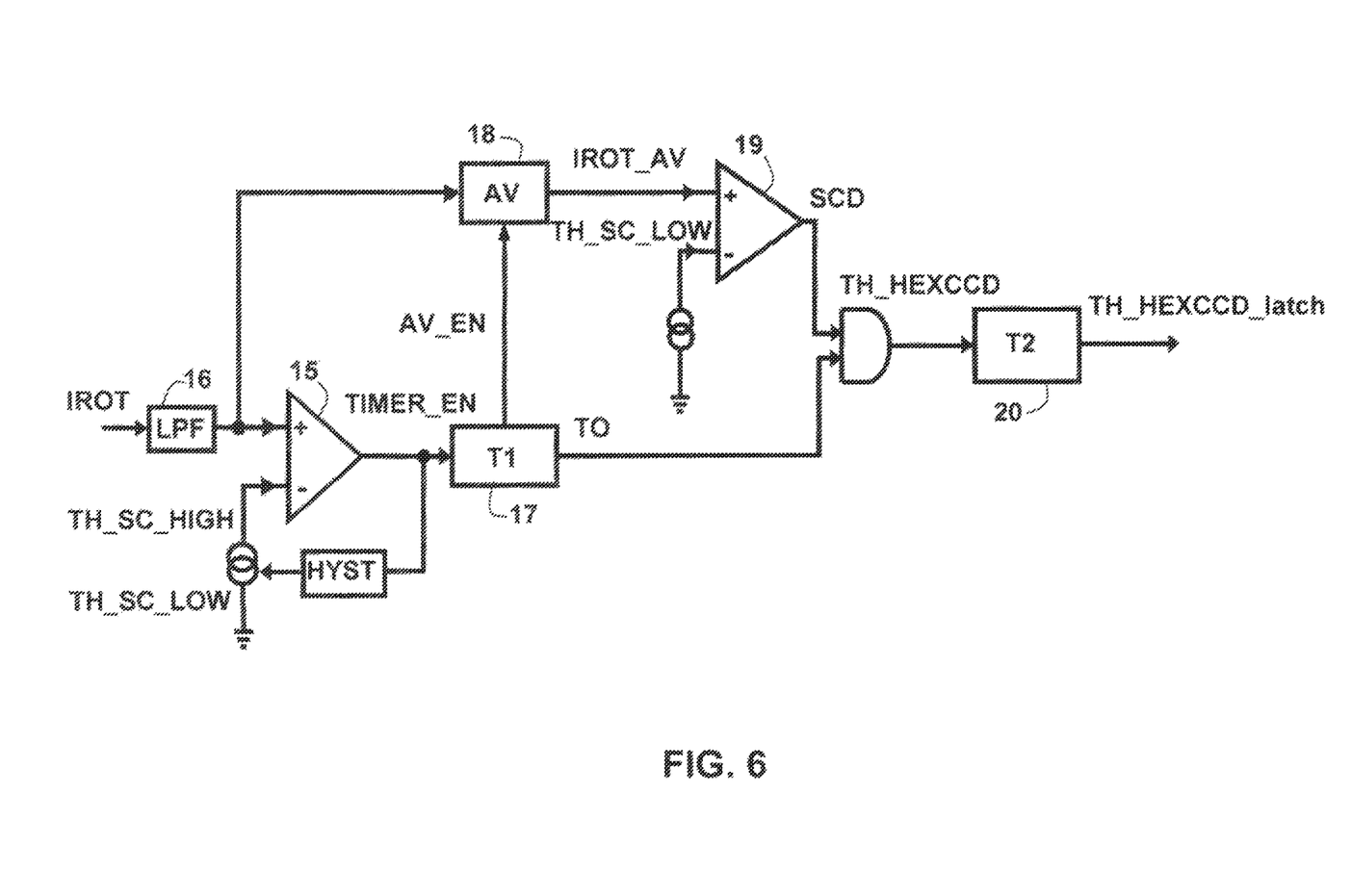
FIG. 6 is a general diagram of detecting a short-circuit in the regulating device according to the invention.

FIG. 6 shows an exemplary embodiment of the time of confirmation and control of the minimum time T_retry_min.

The generic algorithm which is implemented in the processor 14 of the regulating device 4 according to the invention is as follows:
  as soon as a first comparator 15 determines that a measurement of intensity IROT of the excitation current, obtained by means of acquisition and filtering 16 known per se, has reached the predetermined high threshold TH_SC_HIGH, a first counter 17 TIMER_EN is started to generate a first time delay T1 (of 10 µs for example). During this first time delay T1, an estimated value of a short-circuit in the form of a median value IROT_AV of intensity IROT of the excitation current is calculated by means of calculation 18 (AV_EN).
  at the end of counting TO and if a second comparator 19 determines that the calculated median value IROT_AV is greater than a predetermined low threshold TH_SC_LOW, short-circuit SC is detected (SCD) and the detection signal Th_HEXCCD is activated. If median value IROT_AV falls short of low threshold TH_SC_LOW, first counter 17 is re-initialised.
  as soon as the short-circuit detection signal Th_HEXCCD is active, power switch 3 is cut-off with a current slope command.
  switch 3 is maintained in the open state OFF during the second time delay T2 greater than minimum time T_retry_min necessary to dissipate the heat. A second programmable counter 20 enables this second time delay T2 (4 ms for example) to be adapted according to the application and generates a confirmation signal Th HEXCCD_latch.

It goes without saying that the invention is not limited to the sole preferred embodiments described above.

In particular, specific values of the first and second time delays T1, T2 shown above are only given as examples.

The same applies for the particular types of discrete components 3, 9, of analogue circuits 15, 19 or digital circuits 17, 20: they could, alternatively, be replaced by other analogue or digital electronic components which fulfil the same functions.

The invention thus embraces however all possible alternative embodiments which would remain within the framework defined by the claims below.

The invention claimed is:

1. A method for controlling a regulating device (4) of an automotive vehicle alternator slaving a DC voltage (B+A) generated by said alternator to a predetermined setpoint value, said alternator comprising an excitation circuit (3, 6) including an excitation winding (6) of a rotor of said alternator and a semiconductor switch (3) of said regulating device (4), said DC voltage (B+A) slaved by controlling an excitation current ($I_D$) flowing in said excitation circuit (3, 6) by said semiconductor switch (3) controlled by a control signal ($V_{GS}$) having a predetermined period (T), said method comprising the step of detecting a failure of said excitation circuit (3, 6),
  wherein at least one short-circuit (SC) of said excitation winding (6) is detected,
  wherein said control signal ($V_{GS}$) is generated on the basis of a combination (EXC _DR) of a setpoint signal (EXC) formed by pulses of said predetermined period (T) exhibiting a duty ratio (r) representative of said setpoint value and of a detection signal (Th_HEXCCD) indicative of said short-circuit (SC), and wherein said semiconductor switch (3) as a transconductor controlled by said control signal ($V_{GS}$) during at least a first part of said predetermined period (T) with at least one predetermined current slope by limiting an intensity (IROT) of said excitation current ($I_D$) to a predetermined limit value (ILIM).

2. The method according to claim 1, wherein said semiconductor switch (3) is changed into a conductive state (ON) by said control signal ($V_{GS}$) during at least a second part of said predetermined period (T) by limiting said intensity (IROT) of said excitation current ($I_D$) to said predetermined limit value (ILIM).

3. The method according to claim 2, wherein:
as soon as said intensity (IROT) has reached a predetermined high threshold (TH_SC_HIGH), a first counter (17) is started (TIMER_EN) during a first predetermined time delay (T1);
during (AV_EN) said first time delay (T1), an estimated value (IROT_AV) of said short-circuit (SC) is calculated on the basis of said intensity (IROT);
after (T0) said first time delay (T1), if said estimated value (IROT_AV) of said short-circuit (SC) is greater (SCD) than a predetermined low threshold (TH_SC_LOW), said detection signal (Th_HEXCCD) is activated;
if said estimated value (IROT_AV) of said short-circuit (SC) is less than said predetermined low threshold (TH_SC_LOW), said first counter (17) is re-initialised;
after activation of said detection signal (Th_HEXCCD), said semiconductor switch (3) is controlled by said control signal ($V_{GS}$) with said current slope to make a transition to an open state (OFF);
a second predetermined time delay (T2) is generated by a second counter (20) and said semiconductor switch (3) in said open state (OFF) is maintained during said second time delay (T2).

4. A regulating device (4) of an automotive vehicle alternator configured to implement the method according to claim 2, comprising a slaving device (11) for slaving a DC voltage (B+A) generated by said alternator to a setpoint value predetermined by controlling an excitation current ($I_D$) flowing in an excitation circuit (3, 6) comprising an excitation winding (6) of a rotor of said alternator and a semiconductor switch (3) controlled by a control signal ($V_{GS}$) of a predetermined period (T), said regulating device (4) further comprising a failure detection device (12) for detecting a failure of said excitation circuit (3, 6), wherein said failure detection device (12) detects at least one short-circuit (SC) of said excitation winding (6).

5. A regulating device (4) of an automotive vehicle alternator configured to implement the method according to claim 1, comprising a slaving device (11) for slaving a DC voltage (B+A) generated by said alternator to a setpoint value predetermined by controlling an excitation current ($I_D$) flowing in an excitation circuit (3, 6) comprising an excitation winding (6) of a rotor of said alternator and a semiconductor switch (3) controlled by a control signal ($V_{GS}$) of a predetermined period (T), said regulating device (4) further comprising a failure detection device (12) for detecting a failure of said excitation circuit (3, 6), wherein said failure detection device (12) detects at least one short-circuit (SC) of said excitation winding (6).

6. A regulating device (4) of an automotive vehicle alternator configured to implement the method according to claim 1, comprising:
a slaving device (11) for slaving a DC voltage (B+A) generated by said alternator to a setpoint value predetermined by controlling an excitation current ($I_D$) flowing in an excitation circuit (3, 6); and
a failure detection device (12) for detecting a failure of said excitation circuit (3, 6);
said excitation circuit (3, 6) comprising an excitation winding (6) of a rotor of said alternator and a semiconductor switch (3) controlled by a control signal ($V_{GS}$) of a predetermined period (T),
said failure detection device (12) detecting at least one short-circuit (SC) of said excitation winding (6).

7. The regulating device (4) according to claim 6, wherein said slaving device (11) comprises a regulation loop (11) generating a setpoint signal (EXC) formed by pulses exhibiting said predetermined period (T) of a duty ratio (r) representative of said setpoint value and said failure detection device (12) comprise a detection module (12) generating a detection signal (Th_HEXCCD) indicative of said short-circuit (SC), and wherein said regulating device (4) further comprises a combination device (10) to combine said setpoint signal (EXC) and said detection signal (Th_HEXCCD) for producing an input signal (EXC_DR) of a control circuit (13) generating said control signal ($V_{GS}$).

8. The regulating device (4) according to claim 7, wherein said detection module (12) comprises:
a memory device to memorise a predetermined high threshold (TH_SC_HIGH) and a predetermined low threshold (TH_SC_LOW);
an acquisition device (16) to acquire an intensity (IROT) of an excitation current ($I_D$) flowing in said excitation circuit (3, 6);
a first comparison device (15) to compare said intensity (IROT) with said predetermined high threshold (TH_SC_HIGH) and with said predetermined low threshold (TH_SC_LOW);
a first counter (17) triggered (TIMER_EN) by said first comparison device (15) defining a first predetermined time delay (T1);
a calculation device (18) to calculate an estimated value (IROT_AV) of said short-circuit (SC) on the basis of said intensity (IROT) during said first predetermined time delay (T1);
a second comparison device (19) to compare said estimated value (IROT_AV) of said short-circuit (SC) with said predetermined low threshold (TH_SC_LOW);
a second counter (20) triggered by said second comparison device (19) defining a second predetermined time delay (T2).

9. Automotive vehicle alternator comprising a regulating device (4) according to claim 6.

10. A method for controlling a regulating device (4) of an automotive vehicle alternator slaving a DC voltage (B+A) generated by said alternator to a predetermined setpoint value, said alternator comprising an excitation circuit (3, 6) including an excitation winding (6) of a rotor of said alternator and a semiconductor switch (3) of said regulating device (4), said DC voltage (B+A) slaved by controlling an excitation current ($I_D$) flowing in said excitation circuit (3, 6) by said semiconductor switch (3) controlled by a control signal ($V_{GS}$) having a predetermined period (T), said method comprising the step of detecting a failure of said excitation circuit (3, 6), wherein at least one short-circuit (SC) of said excitation winding (6) is detected;

wherein said control signal ($V_{GS}$) is generated on the basis of a combination (EXC_DR) of a setpoint signal (EXC) formed by pulses of said predetermined period (T) exhibiting a duty ratio (r) representative of said setpoint value and of a detection signal (Th_HEXCCD) indicative of said short-circuit (SC);

wherein said semiconductor switch (3) as a transconductor is controlled by said control signal ($V_{GS}$) during at least a first part of said predetermined period (T) with at least one predetermined current slope by limiting an intensity (IROT) of said excitation current ($I_D$) to a predetermined limit value (ILIM); and wherein:
- as soon as said intensity (IROT) has reached a predetermined high threshold (TH_SC_HIGH), a first counter (17) is started (TIMER_EN) during a first predetermined time delay (T1);
- during (AV_EN) said first time delay (T1), an estimated value (IROT_AV) of said short-circuit (SC) is calculated on the basis of said intensity (IROT);
- after (TO) said first time delay (T1), if said estimated value (IROT_AV) of said short-circuit (SC) is greater (SCD) than a predetermined low threshold (TH_SC LOW), said detection signal (Th_HEXCCD) is activated;
- if said estimated value (IROT_AV) of said short-circuit (SC) is less than said predetermined low threshold (TH_SC LOW), said first counter (17) is re-initialised;
- after activation of said detection signal (Th_HEXCCD), said semiconductor switch (3) is controlled by said control signal ($V_{GS}$) with said current slope to make a transition to an open state (OFF);
- a second predetermined time delay (T2) is generated by a second counter (20) and said semiconductor switch (3) in said open state (OFF) is maintained during said second time delay (T2).

11. The method according to claim 10, wherein said limit value (ILIM) and said first time delay (T1) are defined so that a power to be dissipated is less than a maximum power permissible by a heat sink of said semiconductor switch (3).

12. The method according to claim 11, wherein said estimated value of said short-circuit (SC) calculated on the basis of said intensity (IROT) is a median value (IROT_AV) of said intensity (IROT).

13. A regulating device (4) of an automotive vehicle alternator configured to implement the method according to claim 11, comprising a slaving device (11) for slaving a DC voltage (B+A) generated by said alternator to a setpoint value predetermined by controlling an excitation current ($I_D$) flowing in an excitation circuit (3, 6) comprising an excitation winding (6) of a rotor of said alternator and a semiconductor switch (3) controlled by a control signal ($V_{GS}$) of a predetermined period (T), said regulating device (4) further comprising a failure detection device (12) for detecting a failure of said excitation circuit (3, 6), wherein said failure detection device (12) detects at least one short-circuit (SC) of said excitation winding (6).

14. The method according to claim 10, wherein said estimated value of said short-circuit (SC) calculated on the basis of said intensity (IROT) is a median value (IROT_AV) of said intensity (IROT).

15. A regulating device (4) of an automotive vehicle alternator configured to implement the method according to claim 14, comprising a slaving device (11) for slaving a DC voltage (B+A) generated by said alternator to a setpoint value predetermined by controlling an excitation current ($I_D$) flowing in an excitation circuit (3, 6) comprising an excitation winding (6) of a rotor of said alternator and a semiconductor switch (3) controlled by a control signal ($V_{GS}$) of a predetermined period (T), said regulating device (4) further comprising a failure detection device (12) for detecting a failure of said excitation circuit (3, 6), wherein said failure detection device (12) detects at least one short-circuit (SC) of said excitation winding (6).

16. A regulating device (4) of an automotive vehicle alternator configured to implement the method according to claim 10, comprising a slaving device (11) for slaving a DC voltage (B+A) generated by said alternator to a setpoint value predetermined by controlling an excitation current ($I_D$) flowing in an excitation circuit (3, 6) comprising an excitation winding (6) of a rotor of said alternator and a semiconductor switch (3) controlled by a control signal ($V_{GS}$) of a predetermined period (T), said regulating device (4) further comprising a failure detection device (12) for detecting a failure of said excitation circuit (3, 6), wherein said failure detection device (12) detects at least one short-circuit (SC) of said excitation winding (6).

17. A regulating device (4) of an automotive vehicle alternator, comprising:
- a slaving device (11) slaving a DC voltage (B+A) generated by an alternator to a setpoint value predetermined by controlling an excitation current ($I_D$) flowing in an excitation circuit (3, 6);
- a failure detection device (12) operably associated with said excitation circuit (3, 6);
- said excitation circuit (3, 6) comprising an excitation winding (6) of a rotor of said alternator and a semiconductor switch (3) controlled by a control signal ($V_{GS}$) of a predetermined period (T),
- said failure detection device (12) detecting at least one short-circuit (SC) of said excitation winding (6),
- the control signal ($V_{GS}$) is generated on the basis of a combination (EXC_DR) of a setpoint signal (EXC) formed by pulses of the predetermined period (T) exhibiting a duty ratio (r) representative of said setpoint value and of a detection signal (Th_HEXCCD) indicative of a short-circuit (SC), and
- said semiconductor switch (3) as a transconductor is controlled by said control signal ($V_{GS}$) during at least a first part of the predetermined period (T) with at least one predetermined current slope by limiting an intensity (IROT) of said excitation current ($I_D$) to a predetermined limit value (ILIM).

* * * * *